United States Patent
Low et al.

(10) Patent No.: US 10,338,329 B2
(45) Date of Patent: Jul. 2, 2019

(54) ARRANGEMENT FOR CONNECTING PHOTONIC AND ELECTRONIC COMPONENTS

(71) Applicant: Nokia Solutions and Networks Oy, Espoo (FI)

(72) Inventors: Yee Leng Low, New Providence, NJ (US); Nagesh Basavanhally, Skillman, NJ (US)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 15/667,150

(22) Filed: Aug. 2, 2017

(65) Prior Publication Data

US 2019/0041591 A1    Feb. 7, 2019

(51) Int. Cl.
*G02B 6/42* (2006.01)
*H05K 1/14* (2006.01)
*H05K 1/18* (2006.01)

(52) U.S. Cl.
CPC ........... *G02B 6/4257* (2013.01); *G02B 6/428* (2013.01); *G02B 6/4292* (2013.01); *H05K 1/14* (2013.01); *H05K 1/181* (2013.01); *H05K 2201/10015* (2013.01); *H05K 2201/10022* (2013.01)

(58) Field of Classification Search
CPC .... G02B 6/4292; G02B 6/4257; G02B 6/428; H05K 1/14; H05K 1/181
See application file for complete search history.

(56) References Cited

U.S. PATENT DOCUMENTS

| | | | | |
|---|---|---|---|---|
| 6,343,171 B1* | 1/2002 | Yoshimura | ......... | G02B 6/12002 385/50 |
| 2004/0190274 A1* | 9/2004 | Saito | ........................ | G02B 6/43 361/783 |
| 2004/0208460 A1 | 10/2004 | Beer et al. | | |
| 2004/0247256 A1 | 12/2004 | Hurt et al. | | |
| 2005/0196094 A1 | 9/2005 | Glebov et al. | | |
| 2008/0037927 A1 | 2/2008 | Kurihara et al. | | |
| 2010/0183267 A1* | 7/2010 | Becht | ................... | G02B 6/4246 385/88 |
| 2014/0270621 A1 | 9/2014 | Dutt et al. | | |
| 2016/0216445 A1* | 7/2016 | Thacker | ............. | G02B 6/12004 |
| 2018/0114785 A1* | 4/2018 | Budd | ................... | G02B 6/4214 |

* cited by examiner

*Primary Examiner* — Thomas A Hollweg
*Assistant Examiner* — Mary A El-Shammaa
(74) *Attorney, Agent, or Firm* — Mendelsohn Dunleavy, P.C.; Yuri Gruzdkov

(57) ABSTRACT

An optoelectronic device having three substantially planar substrates arranged such that one of the substrates is orthogonal to the other two substrates. In an example embodiment, the first substrate may have one or more photonic devices configured to emit or receive light traveling substantially orthogonally with respect to a major plane of the first substrate. The second substrate has an optical waveguide circuit thereon that is edge-coupled to receive (or transmit) the light from (to) the one or more photonic devices. The third substrate has an electrical circuit thereon and is connected to form an L-shaped junction with the first substrate, the L-shaped junction providing electrical connections between the corresponding electrical transmission lines located on the first and third substrates, e.g., to communicate electrical signals with the one or more photonic devices. In some embodiments, the optoelectronic device can be used to implement an optical transmitter or receiver.

17 Claims, 4 Drawing Sheets

300

ARRANGEMENT FOR CONNECTING PHOTONIC AND ELECTRONIC COMPONENTS

BACKGROUND

Field

The present disclosure relates to optoelectronic packaging and, more specifically but not exclusively, to an arrangement of photonic and electronic components to provide optical and/or electrical interconnects for distributing signals to, from, and/or among said components.

Description of the Related Art

This section introduces aspects that may help facilitate a better understanding of the disclosure. Accordingly, the statements of this section are to be read in this light and are not to be understood as admissions about what is in the prior art or what is not in the prior art.

Different integration and packaging technologies can be used to combine various photonic and electronic components into a practically useful integrated circuit, hybrid circuit, package, and/or assembly. While each of such technologies tends to provide some benefits and/or advantages for certain types of products, the corresponding field continues to expand and evolve, e.g., by providing new solutions for emerging segments of the market. For example, several product-specific factors typically need to be considered before the most appropriate integration and/or packaging method can be selected or developed.

SUMMARY OF SOME SPECIFIC EMBODIMENTS

Disclosed herein are various embodiments of an optoelectronic device having three substantially planar substrates arranged such that one of the substrates is orthogonal to the other two substrates. In an example embodiment, the first substrate may have one or more photonic devices configured to emit or receive light traveling substantially orthogonally with respect to a major plane of the first substrate. The second substrate has an optical waveguide circuit thereon that is edge-coupled to receive (or transmit) the light from (to) the one or more photonic devices. The third substrate has an electrical circuit thereon and is connected to form an L-shaped junction with the first substrate, the L-shaped junction providing electrical connections between the corresponding electrical transmission lines located on the first and third substrates, e.g., to communicate electrical signals with the one or more photonic devices. In some embodiments, the optoelectronic device can be used to implement an optical transmitter or receiver.

According to an example embodiment, provided is an apparatus comprising: a first planar substrate having one or more photonic devices located along a major surface thereof and a plurality of first electrical transmission lines thereon, the one or more photonic devices being coupled to an optical interface, some of the first electrical transmission lines being connected to an electrical interface, the electrical interface at least partially being on the major surface of the first planar substrate; a second planar substrate having an optical waveguide circuit thereon and having an edge adjacent the optical interface such that the optical waveguide circuit is able to communicate light with the one or more photonic devices via the optical interface; and a third planar substrate having a plurality of second electrical transmission lines thereon, some of the second electrical transmission lines being connected to the electrical interface such that said some of the second electrical transmission lines are able to communicate electrical signals with said some of the first electrical transmission lines; and wherein the second and third planar substrates are substantially orthogonal to the major surface of the first planar substrate.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
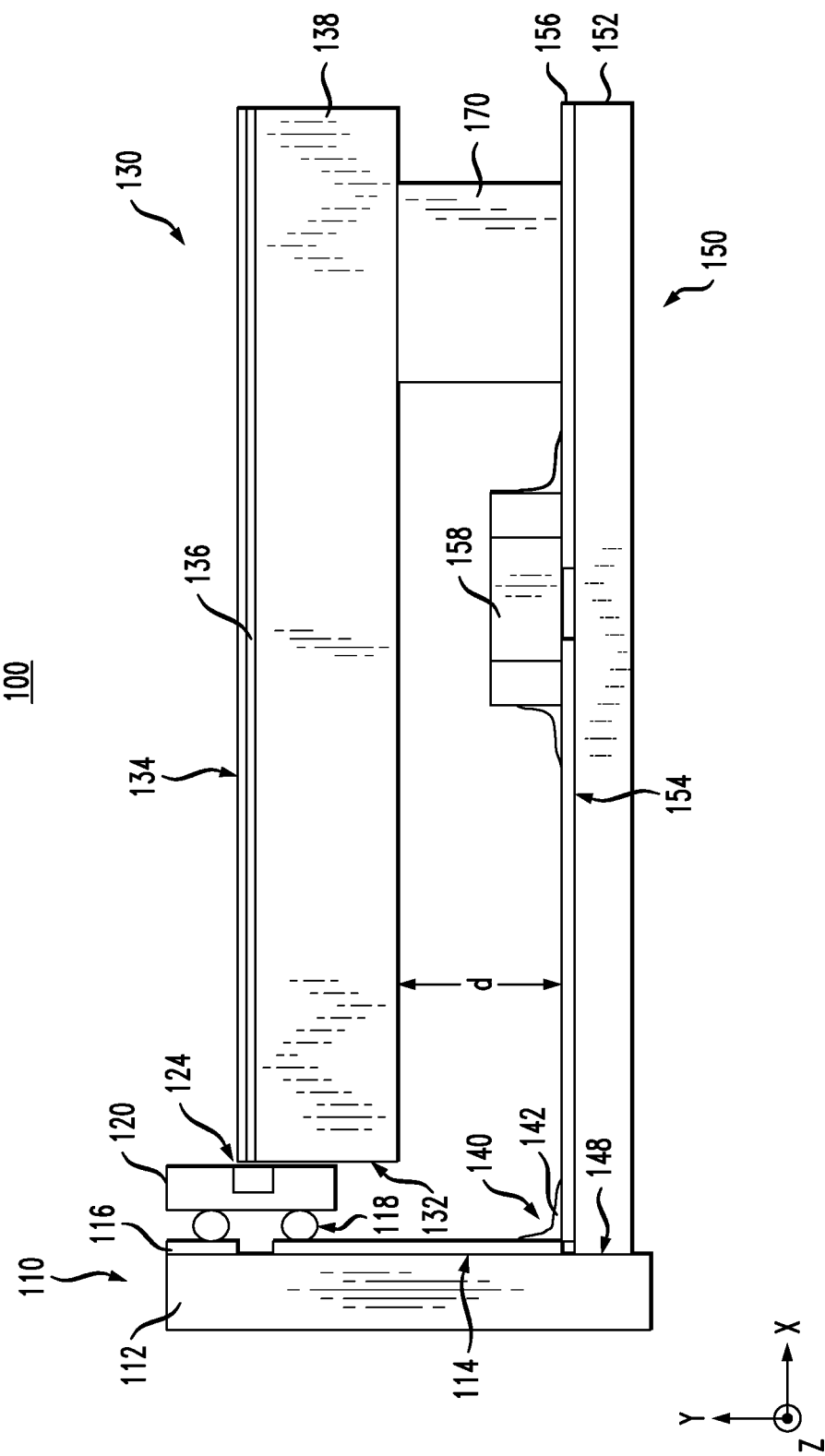
FIG. 1 shows a schematic side view of an optoelectronic device according to an embodiment.

FIG. 1 shows a schematic side view of an optoelectronic device 100 according to an embodiment. Optoelectronic device 100 comprises circuits 110, 130, and 150 that are attached to one another, e.g., as indicated in FIG. 1, to form a mechanically robust package and/or assembly. In an example embodiment, circuit 110 can be an optoelectronic circuit; circuit 130 can be a planar lightwave circuit (PLC); and circuit 150 can be an electrical circuit.

As used herein the term "optoelectronic" refers to an attribute of a device or circuit that enables the latter to operate on both light and electrical currents (voltages). For example, an optoelectronic circuit, such as circuit 110, may include one or more of: (i) an electrically driven light source, such as a laser diode; (ii) an optical amplifier; (iii) an optical-to-electrical converter, such as a photodiode; and (iv) an optoelectronic component that can control the propagation and/or certain properties of light, such as an optical modulator or an optical switch. The optoelectronic circuit may additionally include one or more optical elements and/or one or more electronic components that enable the use of the circuit's optoelectronic components in a manner consistent with the intended function or application.

For illustration purposes and without any implied limitations, circuit 110 is shown in FIG. 1 as comprising a surface-active photonic device 120 mounted on a substrate 112 using a ball-grid array 118. In alternative embodiments, other suitable surface-mounting methods may also be used to attach surface-active device 120 to substrate 112. For example, wire-bond packages and/or flip-chip assemblies may also be used.

Dies intended for wire-bond packages are outfitted with small metal pads, typically located near the die edges. The individual dies are cut out of the wafer, and each die is attached face up on its carrier, such as an interconnecting substrate, a redistribution layer, an interposer, a laminate plate, a wire board, or the like. Electrical wires are then bonded to the metal pads on the face of the die to electrically connect the die to the carrier. These wires and the patterned conducting layers located in the body and/or on the surface of the carrier provide electrical connections between the die and the pins or terminals on the outside of the package. These pins/terminals can then be used to attach and electrically connect the corresponding packaged device to external electrical circuitry, such as substrate 112.

Processing a die intended for a flip-chip assembly is similar but has several additional and/or modified processing steps. For example, the small metal pads on the face of the die may now be arranged in a two-dimensional area array instead of being in one or more linear edge arrays. This design feature can be realized, e.g., by adding dielectric and metal layers configured to appropriately route electrical connections from the functional semiconductor layer(s) of the die to the metal pads. A small dot (bump, ball) of solder is then deposited on each metal pad. The wafer is then diced as customary. The resulting individual dies are fluxed and placed on the respective interconnecting substrates face down (e.g., in a flipped orientation compared to that in a wire-bond package). The solder is then reflowed by being heated to above its melting temperature to form permanent electrical connections between the die and the substrate.

As used herein the term "substrate" refers to a circuit carrier or base designed and configured to provide electrical and/or optical connections between different parts thereof to enable proper operation of electrical, optical, and/or optoelectronic devices located at or connected to those parts. Such devices may include any combination of packaged or non-packaged electronic integrated circuits, photonic integrated circuits, and discrete (e.g., lumped) circuit components. Electrical connections between different parts of the substrate can be formed, e.g., using patterned conducting (such as metal) layers located within the body and/or on the surface of the substrate. Optical connections between different parts of the substrate can be formed, e.g., using optical waveguides fabricated thereon as known in the pertinent art. In some embodiments, the substrate may have several distinct levels, e.g., comprising a redistribution layer (RDL), an interposer, a laminated plate, and/or a printed circuit board.

In an example embodiment, substrate 112 is a substantially planar substrate whose lateral dimensions (e.g., length and width) are significantly larger than its thickness. In the view shown in FIG. 1, the thickness of substrate 112 is the dimension thereof measured along the X-coordinate axis, and the lateral dimensions are the dimensions measured along the Y- and Z-coordinate axes. A surface of substrate 112 that is substantially parallel to the YZ-coordinate plane is referred to as a "major" surface. For example, an exterior surface 114 of substrate 112 is a major surface thereof.

Surface 114 of substrate 112 has a patterned electrically conducting (e.g., metal) layer 116. Some conducting tracks (electrical transmission lines) of layer 116 are electrically connected to (i) ball-grid array 118 and (ii) an electrical interface 140 in a manner that enables proper operation of surface-active device 120. An example of conducting tracks of layer 116 is shown in FIG. 3B.

In various embodiments, surface-active device 120 can emit or receive a light beam traveling approximately along the X direction, i.e., in a direction that is substantially (e.g., within ±10 or ±5 degrees) orthogonal to surface 114 of substrate 112. In an example embodiment, surface-active device 120 can be a vertical-cavity surface-emitting laser (VCSEL), a light detector, an optical modulator, a MEMS device, etc. In an embodiment in which surface-active device (e.g., VCSEL) 120 emits a light beam from a surface aperture 124 thereof, the light beam travels toward a narrow side 132 of circuit 130 where the emitted light couples into an end section of an optical waveguide 136. In an embodiment in which surface-active device (e.g., light detector) 120 receives a light beam, the light beam is emitted from the end section of optical waveguide 136 located at narrow side 132 of circuit 130 and then impinges onto surface aperture 124 of the surface-active device. In either embodiment, optical waveguide 136 of circuit 130 is configured to communicate light with surface aperture 124 of surface-active device 120.

In some embodiments, circuit 130 may include one or more additional optical waveguides (not explicitly shown in FIG. 1), some of which are configured to communicate light with a respective additional aperture (not explicitly shown in FIG. 1) of surface-active device 120 or of an additional surface-active device (not explicitly shown in FIG. 1) attached to or fabricated on substrate 112. The additional optical waveguides may be similar to optical waveguide 136. The additional apertures may be similar to aperture 124. The additional surface-active devices may be similar to surface-active device 120.

In an example embodiment, optical waveguide 136 can be located along an exterior surface 134 of a substrate 138 of circuit 130. Substrate 138 can be a substantially planar substrate whose lateral dimensions (e.g., length and width) are significantly larger than its thickness. In the view shown in FIG. 1, the thickness of substrate 138 is the dimension thereof measured along the Y-coordinate axis, and the lateral dimensions are the dimensions measured along the X- and Z-coordinate axes. A surface of substrate 138 that is substantially parallel to the XZ-coordinate plane is referred to as a "major" surface. For example, surface 134 of substrate 138 is a major surface thereof. A narrow side of substrate 138 that is substantially orthogonal to the XZ-coordinate plane is referred to as an "edge." For example, narrow side 132 of substrate 138 is an edge thereof.

In some embodiments, surface 134 is substantially (e.g., within ±10 or ±5 degrees) orthogonal to surface 114 and/or substrate 112. In some embodiments, substrate 138 is substantially orthogonal to surface 114 and/or substrate 112.

In an example embodiment, circuit 150 comprises a substrate 152, an exterior surface 154 of which has a patterned electrically conducting (e.g., metal) layer 156. Some conducting tracks (electrical transmission lines) of layer 156 are electrically connected to electrical interface 140 in a manner that enables circuit 150 to properly support the functions of circuit 110. An example of conducting tracks of layer 156 is shown in FIG. 3B.

Substrate 152 can be a substantially planar substrate whose lateral dimensions (e.g., length and width) are significantly larger than its thickness. In the view shown in FIG. 1, the thickness of substrate 152 is the dimension thereof measured along the Y-coordinate axis, and the lateral dimensions are the dimensions measured along the X- and Z-coordinate axes. A surface of substrate 152 that is substantially parallel to the XZ-coordinate plane is referred to as a "major" surface. For example, surface 154 of substrate 152 is a major surface thereof. A narrow side of substrate 152 that is substantially orthogonal to the XZ-coordinate plane is referred to as an "edge." For example, a narrow side 148 of substrate 152 is an edge thereof.

In some embodiments, surface 154 is substantially (e.g., within ±10 or ±5 degrees) orthogonal to surface 114 and/or substrate 112. In some embodiments, substrate 152 is substantially orthogonal to surface 114 and/or substrate 112. In some embodiments, substrate 152 is substantially (e.g., within ±10 or ±5 degrees) parallel to substrate 138.

Circuit 150 further comprises one or more electronic components attached to substrate 152 and electrically connected to the corresponding conducting tracks of layer 156. For illustration purposes and without any implied limitations, only one discrete electronic component, e.g., a resistor or capacitor 158, is shown in FIG. 1. Component 158 is electrically connected to electrical interface 140 by way of the corresponding conducting track(s) of layer 156, as indicated in FIG. 1. In an alternative embodiment, circuit 150 may have one or more additional electronic components (not explicitly shown in FIG. 1) attached to substrate 152 and electrically connected to the corresponding conducting tracks of layer 156. Some of these additional electronic components may also be electrically connected to electrical interface 140.

In an example embodiment, electrical interface 140 has a physical structure that electrically connects a subset of conducting tracks of layer 156 of circuit 150 and the corresponding subset of conducting tracks of layer 116 of circuit 110. In some embodiments, this physical structure of electrical interface 140 may also serve to fixedly attach circuits 110 and 150 to one another and/or secure them in a desired relative orientation. As an example, FIG. 1 shows an embodiment of electrical interface 140 in which a solder joint 142 electrically connects the corresponding pair of conducting tracks in layers 116 and 156. Solder joint 142 can be formed, e.g., by reflowing a solder ball placed at the junction between the corresponding conducting tracks of layers 116 and 156. In some embodiments, electrical interface 140 may have one or more additional solder joints that are similar to solder joint 142, each being located at the corner of the L-shaped junction between circuits 110 and 150 to electrically connect the other respective pairs of conducting tracks in layers 116 and 156. An example of such multiple solder joints 142 is shown in FIG. 3B.

In an example embodiment, an L-shaped junction between circuits 110 and 150 can be formed by placing edge 148 of substrate 152 next and parallel to surface 114 of substrate 112, e.g., as indicated in FIG. 1.

In an alternative embodiment, electrical interface 140 may be implemented using any suitable connector(s) that (i) electrically connect the corresponding subsets of conducting tracks in layers 156 and 116 and (ii) help or serve to mechanically fix the desired relative orientation of circuits 110 and 150.

Device 100 may also include one or more standoff blocks 170 attached between circuits 130 and 150 to secure these circuits at a desired fixed offset distance d with respect to one another. In an example embodiment, the offset distance d may be selected such that the end of waveguide 136 located at side 132 of circuit 130 is properly lined up with aperture 124 of surface-active device 120, e.g., as indicated in FIG. 1.

Figure 2:
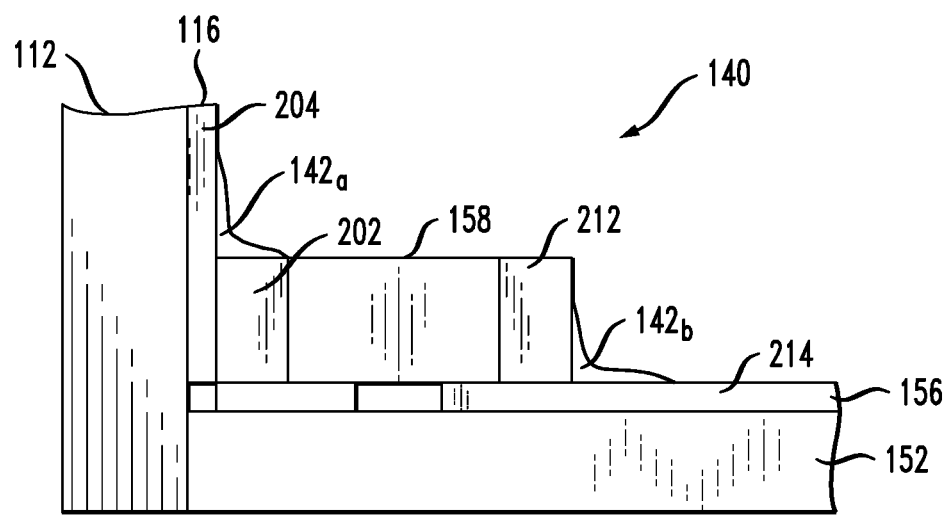
FIG. 2 shows a schematic side view of an electrical interface that can be used in the optoelectronic device of FIG. 1 according to an alternative embodiment.

FIG. 2 shows a schematic side view of electrical interface 140 that can be used in optoelectronic device 100 (FIG. 1) according to an alternative embodiment. In this particular embodiment, a discrete electronic component (e.g., a resistor or capacitor) 158 is placed at the corner of the L-shaped junction between circuits 110 and 150 and is directly electrically connected to the corresponding conducting tracks of layers 116 and 156. More specifically, a first solder joint $142_a$ is used to fixedly attach and electrically connect a first terminal 202 of electronic component 158 to a corresponding conducting track 204 of layer 116. A second solder joint $142_b$ is similarly used to fixedly attach and electrically connect a second terminal 212 of electronic component 158 to a corresponding conducting track 214 of layer 156.

This particular embodiment of electrical interface 140 can be beneficial in that it may: (i) be relatively strong mechanically, e.g., due to the use of two solder joints 142 instead of one and the additional restriction of the relative flex of substrates 112 and 152 caused by the body of electronic component 158, and (ii) reduce the impedance discontinuity at the electrical interface for the radio-frequency (RF) signal crossing between circuits 110 and 150.

Figure 3A:
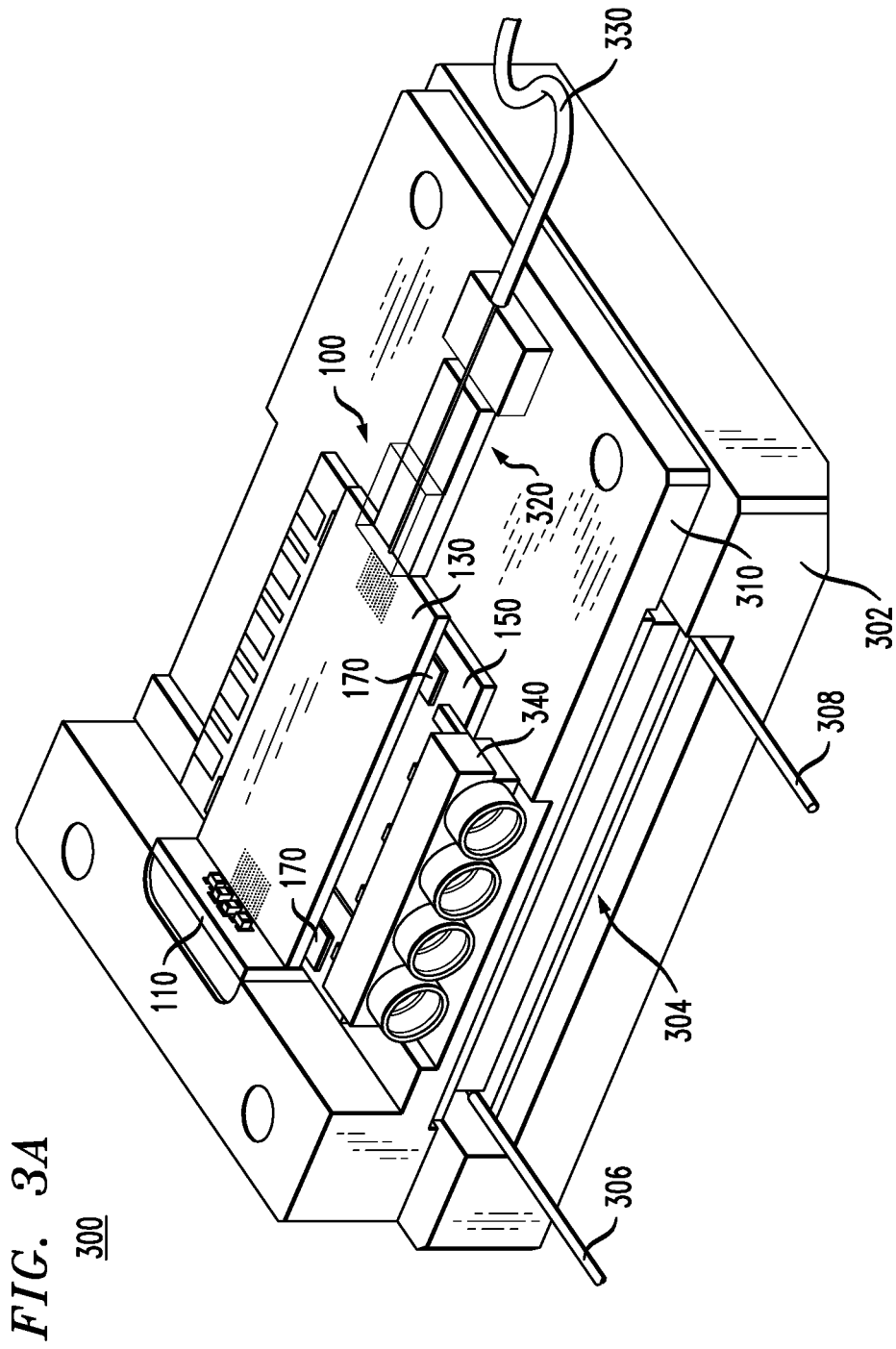
FIGS. 3A-3B show three-dimensional perspective views of an example optical transmitter that incorporates the optoelectronic device of FIG. 1 according to an embodiment.
Figure 3B:
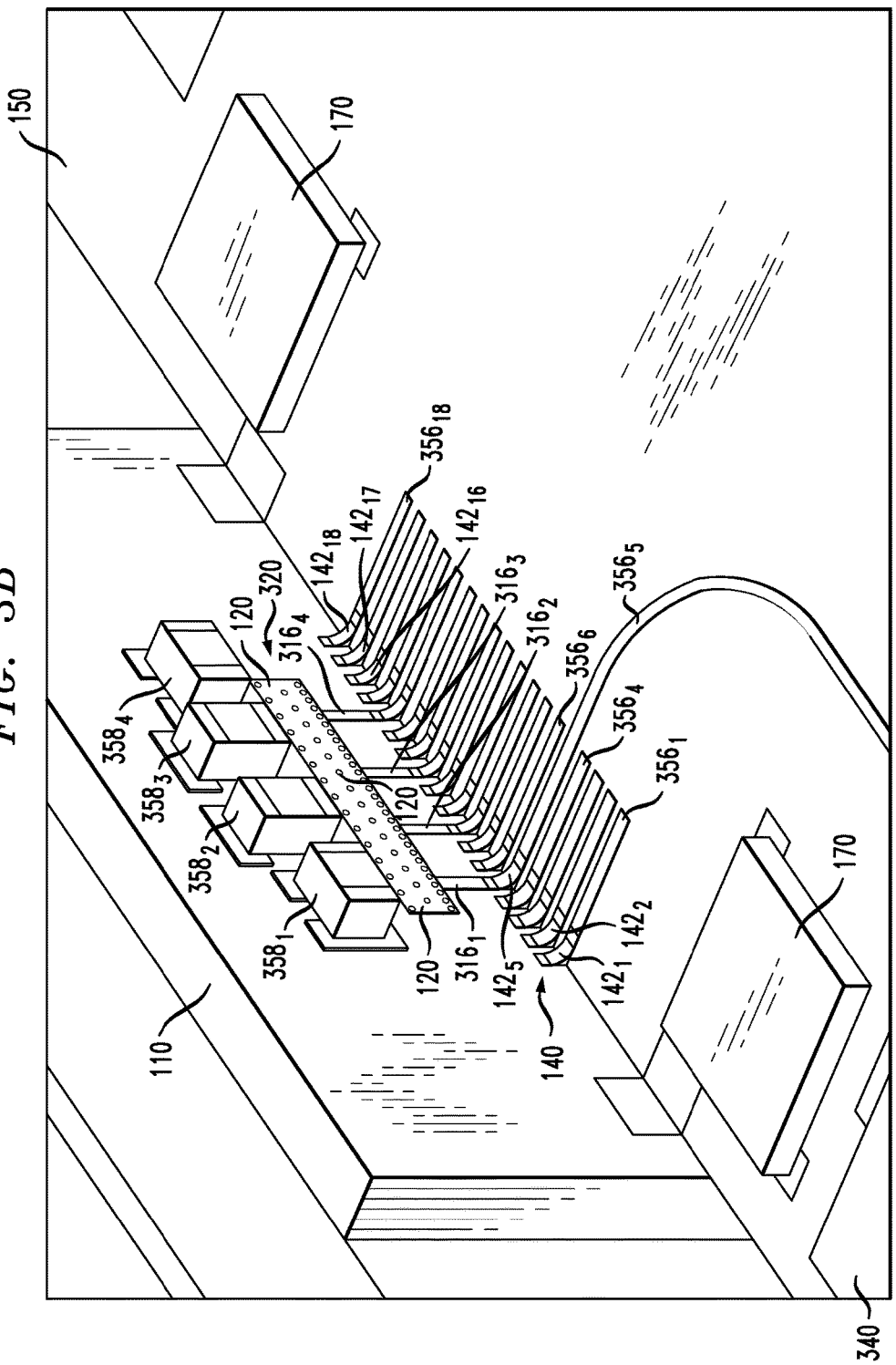

FIGS. 3A-3B show three-dimensional perspective views of an optical transmitter 300 that incorporates optoelectronic device 100 (FIG. 1) according to an embodiment. More specifically, FIG. 3A shows an overall view of transmitter 300. FIG. 3B shows an enlarged view of a portion of transmitter 300, without circuit 130 being shown therein to more clearly show some features of the transmitter not visible or obscured in the view shown in FIG. 3A.

Referring to FIG. 3A, transmitter 300 has a base plate 310 on which device 100 and other components of the transmitter can be securely mounted. In an example embodiment, base plate 310 can be relatively thick and/or rigid to provide mechanical stability and good structural support to the components mounted thereon. The geometric shape of base plate 310 is such that the various components of the transmitter can be positioned and secured thereon in proper relative orientations with relative ease and/or convenience.

Base plate 310 is attached to a chassis 302 that may by a part of the corresponding housing. Chassis 302 has a slot 304 located under base plate 310 that enables additional electrical circuits to be placed therein and optionally connected to device 100, e.g., using wires fed through holes (not explicitly shown in FIG. 3A) in the base plate. As an example, FIG. 3A shows an embodiment in which slot 304 is used to house therein a thermoelectric cooler, which is connected to an external power supply using wires 306 and 308. This thermoelectric cooler can be used, e.g., to control the temperature of device 100 as known in the pertinent art.

In addition to device 100, base plate 310 has attached thereto and supports a fiber connector 320 and an array of RF connectors 340.

Fiber connector 320 enables an external optical fiber 330 to be edge-connected to circuit 130. In an example embodiment, fiber connector 320 can be used, e.g., to optically connect fiber 330 and optical waveguide 136 in a manner that enables the fiber to communicate light with surface-active device 120 of circuit 110 by way of that optical waveguide (also see FIG. 1).

RF connectors 340 are electrically connected to the corresponding conducting tracks of layer 156 in circuit 150 (see FIG. 3B) and can be used, e.g., to provide electrical paths for the electrical RF signals communicated between device 100 and external electrical circuits (not explicitly shown in FIG. 3A). In some embodiments, an additional array of RF connectors 340 can be placed at the opposite side of base plate 310 and similarly connected to the corresponding conducting tracks of layer 156 in circuit 150.

In the view shown in FIG. 3B, some conducting tracks of layers 116 (circuit 110) and 156 (circuit 150) are fully or partially visible, e.g., conducting tracks (electrical transmission lines) $316_1$-$316_4$ and $356_1$-$356_{18}$. Each of conducting tracks $316_1$-$316_4$ is a part of layer 116 of circuit 110. Each of conducting tracks $356_1$-$356_{18}$ is a part of layer 156 of circuit 150. For example, conducting track $356_5$ connects electrical interface 140 and one of RF connectors 340. Each of conducting tracks $316_1$-$316_4$ connects electrical interface 140 and the respective one of surface-active devices 120.

For illustration purposes, not all of the conducting tracks of layers 116 (circuit 110) and 156 (circuit 150) are explicitly shown in FIG. 3B.

In the shown embodiment, circuit 110 has at least four surface-active devices (e.g., VCSELs) 120 arranged in a linear array 320. Electrical interface 140 includes solder joints 142₁-142₁₈, each located at the corner of the L-shaped junction between circuits 110 and 150 to directly electrically connect the corresponding conducting tracks of layers 116 and 156 corresponding to the four surface-active devices 120. For example, solder joint 142₅ electrically connects conducting track 316₁ of circuit 110 and conducting track 356₅ of circuit 150.

In the shown embodiment, circuit 110 includes termination resistors 358₁-358₄, each connected to a corresponding one of conducting tracks 316₁-316₄. In operation, termination resistors 358₁-358₄ serve to minimize or prevent reflections of the RF power applied to conducting tracks 316₁-316₄ through electrical interface 140. In an example embodiment, resistors 358₁-358₄ may be similar to some of the above-described discrete electronic components 158 that may be used in some embodiments of circuit 150 (see FIG. 1).

Also visible in FIG. 3B are two standoff blocks 170 (also see FIG. 1). When circuit 130 is placed onto these standoff blocks 170, e.g., as indicated in FIG. 3A, the ends of one or more waveguides 136 located at edge 132 of circuit 130 become lined up with apertures 124 of the corresponding surface-active devices 120, e.g., as indicated in FIG. 1. In operation, light generated by surface-active devices (e.g., VCSELs) 120 is coupled into the end sections of the corresponding waveguides 136 and multiplexed by circuit 130 to be applied, by way of fiber connector 320, to optical fiber 330 (see FIG. 3A).

A person of ordinary skill in the art will understand that an optical receiver can be implemented similar to optical transmitter 300 using a suitable alternative embodiment of optoelectronic device 100.

According to an example embodiment disclosed above in reference to FIGS. 1-3, provided is an apparatus (e.g., 300, FIG. 3A) comprising: a first planar substrate (e.g., 112, FIG. 1) having one or more photonic devices (e.g., 120, FIGS. 1, 3B) located along a major surface (e.g., 114, FIG. 1) thereof and a plurality of first electrical transmission lines (e.g., 316, FIG. 3B) thereon, the one or more photonic devices being coupled to an optical interface (e.g., through 124, FIG. 1), some of the first electrical transmission lines being connected to an electrical interface (e.g., 140, FIGS. 1, 2, 3B), the electrical interface at least partially being on the major surface of the first planar substrate; a second planar substrate (e.g., 138, FIG. 1) having an optical waveguide circuit (e.g., including 136, FIG. 1) thereon and having an edge (e.g., 132, FIG. 1) adjacent the optical interface such that the optical waveguide circuit is able to communicate light with the one or more photonic devices via the optical interface; and a third planar substrate (e.g., 152, FIG. 1) having a plurality of second electrical transmission lines (e.g., 356, FIG. 3B) thereon, some of the second electrical transmission lines being connected (e.g., using 142, FIGS. 1, 2, 3B) to the electrical interface such that said some of the second electrical transmission lines are able to communicate electrical signals with said some of the first electrical transmission lines; and wherein the second and third planar substrates are substantially (e.g., within ±10 or ±5 degrees) orthogonal to the major surface of the first planar substrate.

In some embodiments of the above apparatus, both of the second and third planar substrates are located at a same side of the first planar substrate (e.g., as indicated in FIG. 1).

In some embodiments of any of the above apparatus, each of the one or more photonic devices is able to emit or receive a respective light beam traveling in a direction that is substantially (e.g., within ±10 or ±5 degrees) orthogonal to the major surface of the first substrate.

In some embodiments of any of the above apparatus, the apparatus further comprises a fiber connector (e.g., 320, FIG. 3A) configured to hold one or more end segments of one or more optical fibers (e.g., 330, FIG. 3A) such that the optical waveguide circuit is able to communicate the light with the one or more optical fibers.

In some embodiments of any of the above apparatus, the electrical interface comprises one or more solder joints (e.g., 142, FIGS. 1, 2, 3B), each electrically connecting a respective one of the first transmission lines and a respective one of the second transmission lines.

In some embodiments of any of the above apparatus, the first planar substrate and the third planar substrate are connected to form an L-shaped junction (e.g., as shown in FIG. 1); and wherein the one or more solder joints are located at a corner of the L-shaped junction (e.g., as indicated in FIGS. 1 and 3B).

In some embodiments of any of the above apparatus, the electrical interface comprises one or more lumped electronic components (e.g., 158, FIG. 2), each connected between a respective one of the first transmission lines and a respective one of the second transmission lines.

In some embodiments of any of the above apparatus, the electrical interface further comprises one or more first solder joints (e.g., 142$_a$, FIG. 2) and one or more second solder joints (e.g., 142$_b$, FIG. 2), each of the first solder joints electrically connecting a first end terminal of a respective lumped electronic component and the respective one of the first transmission lines, each of the second solder joints electrically connecting a second end terminal of the respective lumped electronic component and the respective one of the second transmission lines.

In some embodiments of any of the above apparatus, the one or more lumped electronic components include one or more capacitors.

In some embodiments of any of the above apparatus, the one or more lumped electronic components include one or more resistors.

In some embodiments of any of the above apparatus, the optical interface includes one or more apertures (e.g., 124, FIG. 1) of the one or more photonic devices.

In some embodiments of any of the above apparatus, the one or more photonic devices include at least three photonic devices arranged in a linear array (e.g., 320, FIG. 3B).

In some embodiments of any of the above apparatus, the one or more photonic devices include one or more of: an electrically driven light source; an optical amplifier; a light detector; an optical modulator; and an optical switch.

In some embodiments of any of the above apparatus, the one or more photonic devices include one or more vertical-cavity surface-emitting lasers configured to emit light toward the edge of the second planar substrate.

In some embodiments of any of the above apparatus, the apparatus further comprises one or more physical standoffs (e.g., 170, FIGS. 1, 3) between the second and third planar substrates, the one or more physical standoffs rigidly fixing a separation distance (e.g., d, FIG. 1) between the second and third planar substrates.

In some embodiments of any of the above apparatus, the apparatus further comprises an optical transmitter (e.g., 300, FIG. 3A) that includes the first, second, and third planar substrates.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

For the purposes of this specification, a micro-electro-mechanical-systems (MEMS) device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. The scale/size of certain elements in a MEMS device may be such as to permit manifestation of quantum effects. Examples of MEMS devices include, without limitation, NEMS (nano-electro-mechanical systems) devices, MOEMS (micro-opto-electro-mechanical systems) devices, micromachines, microsystems, and devices produced using microsystems technology or microsystems integration.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three-dimensional structure as shown in the figures. Such "height" would be vertical where the layers are horizontal but would be horizontal where the layers are vertical, and so on. Similarly, while the figures show some layers as horizontal layers, such orientation is for descriptive purposes only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

What is claimed is:

1. An apparatus comprising:
    a first planar substrate having one or more photonic devices located along a major surface thereof and a plurality of first electrical transmission lines thereon, each of the one or more photonic devices comprising a respective surface aperture, some of the first electrical transmission lines being connected to an electrical interface, the electrical interface at least partially being on the major surface of the first planar substrate;
    a second planar substrate having an optical waveguide circuit thereon and having an edge adjacent the one or more photonic devices to enable the optical waveguide circuit to communicate light between the edge and the one or more respective surface apertures of the one or more photonic devices without causing the communicated light to pass through another optical element therebetween; and
    a third planar substrate having a plurality of second electrical transmission lines thereon, some of the second electrical transmission lines being connected to the electrical interface such that said some of the second electrical transmission lines are able to communicate electrical signals with said some of the first electrical transmission lines; and
    wherein the second and third planar substrates are substantially orthogonal to the major surface of the first planar substrate.

2. The apparatus of claim 1, wherein both of the second and third planar substrates are located at a same side of the first planar substrate.

3. The apparatus of claim 1, wherein each of the one or more photonic devices is able to emit or receive, through the respective surface aperture, a respective light beam traveling in a direction that is substantially orthogonal to the major surface of the first substrate.

4. The apparatus of claim 1, further comprising a fiber connector configured to hold one or more end segments of one or more optical fibers such that the optical waveguide circuit is able to communicate light with the one or more optical fibers.

5. The apparatus of claim 1, wherein the electrical interface comprises one or more solder joints, each electrically connecting a respective one of the first transmission lines and a respective one of the second transmission lines.

6. The apparatus of claim 5,
wherein the first planar substrate and the third planar substrate are connected to form an L-shaped junction; and
wherein the one or more solder joints are located at a corner of the L-shaped junction.

7. The apparatus of claim 1, wherein the electrical interface comprises one or more lumped electronic components, each fixedly attached and electrically connected to a respective one of the first transmission lines and to a respective one of the second transmission lines to reduce an impedance discontinuity for a respective radio-frequency signal crossing therebetween and to restrict relative flex of the first and third planar substrates.

8. The apparatus of claim 7, wherein the electrical interface further comprises one or more first solder joints and one or more second solder joints, each of the first solder joints electrically connecting a first end terminal of a respective lumped electronic component and the respective one of the first transmission lines, each of the second solder joints electrically connecting a second end terminal of the respective lumped electronic component and the respective one of the second transmission lines.

9. The apparatus of claim 7, wherein the one or more lumped electronic components include one or more capacitors.

10. The apparatus of claim 7, wherein the one or more lumped electronic components include one or more resistors.

11. The apparatus of claim 1, wherein the one or more photonic devices include at least three photonic devices arranged in a linear array.

12. The apparatus of claim 1, wherein the one or more photonic devices include one or more of:
an electrically driven light source;
an optical amplifier;
a light detector;
an optical modulator; and
an optical switch.

13. The apparatus of claim 1, wherein the one or more photonic devices include one or more vertical-cavity surface-emitting lasers configured to emit light toward the edge of the second planar substrate.

14. The apparatus of claim 1, further comprising:
one or more physical standoffs between the second and third planar substrates, the one or more physical standoffs rigidly fixing a separation distance between the second and third planar substrates; and
one or more lumped electronic components on a surface of the third planar substrate facing the second planar substrate, each of the one or more lumped electronic components having a respective height that is smaller than the separation distance.

15. The apparatus of claim 1, further comprising an optical transmitter that includes the first, second, and third planar substrates.

16. An apparatus comprising:
a first planar substrate having one or more photonic devices located along a major surface thereof and a plurality of first electrical transmission lines thereon, each of the one or more photonic devices comprising a respective surface aperture, some of the first electrical transmission lines being connected to an electrical interface, the electrical interface at least partially being on the major surface of the first planar substrate;
a second planar substrate having an optical waveguide circuit thereon and having an edge adjacent the one or more photonic devices to enable the optical waveguide circuit to communicate light directly between the edge and the one or more respective surface apertures of the one or more photonic devices; and
a third planar substrate having a plurality of second electrical transmission lines thereon, some of the second electrical transmission lines being connected to the electrical interface such that said some of the second electrical transmission lines are able to communicate electrical signals with said some of the first electrical transmission lines; and
wherein the second and third planar substrates are substantially orthogonal to the major surface of the first planar substrate.

17. An apparatus comprising:
a first planar substrate having one or more photonic devices located along a major surface thereof and a plurality of first electrical transmission lines thereon, the one or more photonic devices being coupled to an optical interface, some of the first electrical transmission lines being connected to an electrical interface, the electrical interface at least partially being on the major surface of the first planar substrate;
a second planar substrate having an optical waveguide circuit thereon and having an edge adjacent the optical interface such that the optical waveguide circuit is able to communicate light with the one or more photonic devices via the optical interface; and
a third planar substrate having a plurality of second electrical transmission lines thereon, some of the second electrical transmission lines being connected to the electrical interface such that said some of the second electrical transmission lines are able to communicate electrical signals with said some of the first electrical transmission lines;
wherein the second and third planar substrates are substantially orthogonal to the major surface of the first planar substrate; and
wherein the electrical interface comprises one or more lumped electronic components, each fixedly attached and electrically connected to a respective one of the first transmission lines and to a respective one of the second transmission lines to reduce an impedance discontinuity for a respective radio-frequency signal crossing therebetween and to restrict relative flex of the first and third planar substrates.

* * * * *